US011527985B2

(12) United States Patent
Roadley-Battin

(10) Patent No.: US 11,527,985 B2
(45) Date of Patent: Dec. 13, 2022

(54) CONTROL SYSTEMS

(71) Applicant: Hamilton Sundstrand Corporation, Charlotte, NC (US)

(72) Inventor: Jonathan Mark Roadley-Battin, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 165 days.

(21) Appl. No.: 16/988,948

(22) Filed: Aug. 10, 2020

(65) Prior Publication Data

US 2021/0143767 A1    May 13, 2021

(30) Foreign Application Priority Data

Nov. 8, 2019 (EP) .................................... 19275120

(51) Int. Cl.
  *H02P 29/024* (2016.01)
  *H03K 5/24* (2006.01)
  *G01R 19/165* (2006.01)
  *G01R 31/34* (2020.01)

(52) U.S. Cl.
  CPC ...... *H02P 29/024* (2013.01); *G01R 19/16571* (2013.01); *G01R 31/343* (2013.01); *H03K 5/24* (2013.01)

(58) Field of Classification Search
  CPC ... H02P 29/024; H03K 5/24; G01R 19/16571; G01R 31/343
  See application file for complete search history.

(56) References Cited

U.S. PATENT DOCUMENTS

| 6,518,722 | B1 | 2/2003 | Giuseppe |
| 6,667,597 | B2 | 12/2003 | Fedigan et al. |
| 6,777,906 | B1 | 8/2004 | Kinpara et al. |
| 9,966,889 | B2 | 5/2018 | Zhao et al. |
| 9,966,891 | B2 | 5/2018 | Wang et al. |
| 10,197,977 | B2 * | 2/2019 | Salsbury .................. F24F 11/30 |
| 10,579,023 | B2 * | 3/2020 | Salsbury ................ G05B 11/42 |
| 10,845,070 | B2 * | 11/2020 | Salsbury .................. F24F 11/30 |
| 2014/0203754 | A1 | 7/2014 | Bhangu et al. |

(Continued)

FOREIGN PATENT DOCUMENTS

EP    3252548 A1 * 12/2017    ......... G05B 13/0255

OTHER PUBLICATIONS

European Search Report for Application No. 19275120.4, dated Jun. 9, 2020, 12 pages.

*Primary Examiner* — Thai T Dinh
(74) *Attorney, Agent, or Firm* — Cantor Colburn LLP

(57) ABSTRACT

A closed loop control system for controlling a plant comprises a controller includes an input arranged to receive a feedback signal from the plant. The controller is arranged to compare a value of the feedback signal to a set point value x(s) and to produce an error signal ε(s) that is at least partially dependent on a difference between the value of the feedback signal and the set point value. The controller also includes an output arranged to supply the error signal ε(s) to the plant. A monitor is arranged to compare a value of the error signal ε(s) produced by the controller to a threshold value and to produce a warning signal when the value of the error signal ε(s) exceeds the threshold value for a period of time greater than a predetermined period.

11 Claims, 9 Drawing Sheets

(56) References Cited

U.S. PATENT DOCUMENTS

| | | | | |
|---|---|---|---|---|
| 2014/0257528 A1* | 9/2014 | Perez | ............... | G05B 13/047 |
| | | | | 700/46 |
| 2016/0098020 A1* | 4/2016 | Salsbury | ............... | F24F 11/30 |
| | | | | 700/32 |
| 2016/0233815 A1* | 8/2016 | Ishikawa | ............... | H02P 29/027 |
| 2016/0282820 A1* | 9/2016 | Perez | ............... | G05B 13/047 |
| 2019/0146423 A1* | 5/2019 | Salsbury | ............... | F24F 11/62 |
| | | | | 702/182 |

* cited by examiner

CONTROL SYSTEMS

FOREIGN PRIORITY

This application claims priority to European Patent Application No. 19275120.4 filed Nov. 8, 2019, the entire contents of which is incorporated herein by reference.

TECHNICAL FIELD

This disclosure relates to control systems, in particular to closed loop control systems in which the input to a plant, such as a motor drive system, is controlled in response to the output of the plant.

BACKGROUND ART

It is often an aim in control systems to control a 'plant' (i.e. a controlled entity, typically a combination of process and actuator) under 'closed loop' operation. Those skilled in the art will readily appreciate that a closed loop control system is a control system that relies on feedback from the output of the plant in order to vary an input to that plant, thus 'steering' the output of the plant toward a set point.

The difference between the feedback signal (which may be the output of the plant itself or may be derived from the output of the plant) and the set point is used by the controller to generate an error signal. The magnitude of the error signal is indicative of how far from the set point the current output of the plant is. Generally, the greater the difference between the feedback signal and set point, the greater the magnitude of the error signal.

This error signal is supplied to the plant as an input by the controller, where the error signal is then used by the plant during operation, which then leads to a change in the output. This change in the output of the plant is measured through the feedback loop and the error signal adjusted accordingly. Under correct operation, this feedback loop acts so as to drive the error signal to zero, i.e. to drive the output of the plant to the desired set point.

Closed loop controllers are well suited to applications in which there is a level of uncertainty regarding the plant or the feedback because, as outlined above, the controller acts on the error between the set point and the feedback from the plant. Thus a closed loop controller acts on deviations, be it load disturbances or changes in demand. Closed loop controllers depend on a correctly design system otherwise there is the possibility of instability. Gain and phase margin constraints are typical on closed loop feedback controllers.

While the controller may be able to successfully control the plant so as to drive the output of the plant to the desired set point, in some instances the controlled system may not be as responsive as would otherwise be desirable, which may be due to a problem with the plant and/or the controller itself. For example, a system may include a motor (the plant) and a suitable controller that operates the motor in closed loop. A build-up of rust or a change in the load could result in the controlled system becoming 'sluggish', even if the controller is ultimately able to steer the motor to the set point. Eventually, this may lead to a catastrophic failure, e.g. parts failing or the system tripping due to excessive current draw (i.e. through use of overcurrent protection).

Catastrophic failure results in reactive maintenance, i.e. to rectify the cause of the problem after failure. While proactive steps could be taken, e.g. with a regular maintenance schedule, their effectiveness cannot be guaranteed. It would be advantageous to provide a control system that could proactively determine if there is an issue with the controlled system, whether the issue is with the plant or the controller itself.

SUMMARY OF THE DISCLOSURE

In accordance with a first aspect, the present disclosure provides a closed loop control system for controlling a plant, the control system comprising: a controller comprising an input arranged to receive a feedback signal from the plant, said controller being arranged to compare a value of said feedback signal to a set point value and to produce an error signal that is at least partially dependent on a difference between the value of the feedback signal and the set point value, said controller further comprising an output arranged to supply said error signal to the plant; a monitor arranged to compare a value of the error signal produced by the controller to a threshold value; wherein the monitor is further arranged produce a warning signal when said value of the error signal exceeds the threshold value for a period of time greater than a predetermined period.

This first aspect of the disclosure extends to a closed loop controlled plant system comprising: a plant arranged to receive an input signal and to provide an output signal at least partially dependent on the input signal; a controller comprising an input arranged to receive a feedback signal derived from the output signal produced by the plant, said controller being arranged to compare a value of said feedback signal to a set point value and to produce an error signal that is at least partially dependent on a difference between the value of the feedback signal and the set point value, said controller further comprising an output arranged to supply said error signal to the plant; a monitor arranged to compare a value of the error signal produced by the controller to a threshold value; wherein the monitor is further arranged produce a warning signal when said value of the error signal exceeds the threshold value for a period of time greater than a predetermined period.

The first aspect of the disclosure further extends to a method of controlling a plant in closed loop, the method comprising: receiving a feedback signal from the plant; comparing a value of said feedback signal to a set point value; producing an error signal that is at least partially dependent on a difference between the value of the feedback signal and the set point value; supplying said error signal to the plant; comparing a value of the error signal to a threshold value; and producing a warning signal when the value of the error signal exceeds the threshold value for a period of time greater than a predetermined period.

The first aspect of the disclosure also extends to a non-transitory computer-readable medium comprising instructions that, when executed by a suitable processor, carry out a method of controlling a plant in closed loop, the method comprising: receiving a feedback signal from the plant; comparing a value of said feedback signal to a set point value; producing an error signal that is at least partially dependent on a difference between the value of the feedback signal and the set point value; supplying said error signal to the plant; comparing a value of the error signal to a threshold value; and producing a warning signal when the value of the error signal exceeds the threshold value for a period of time greater than a predetermined period.

Thus it will be appreciated that aspects of the present disclosure provide an improved control system in which defects in both the plant and in the controller itself can be detected. Unlike conventional systems, known in the art per se, in which the error signal is used only to control operation of the plant, a control system in accordance with the present disclosure monitors the state of the error signal to determine the operating condition (or 'health') of the controlled system.

In other words, if the value of the error signal is sufficiently large (i.e. greater than the threshold value) for an extended period of time (i.e. longer than the predetermined period), this raises a flag, i.e. the warning signal, that indicates that a defect may have occurred, e.g. within the plant or the controlled system. Using the example previously given in which a build-up of rust affects operation of a controlled motor, this warning signal may be indicative of the rust build-up such that while operation of the motor can continue as normal, the signal indicates that preventative measures should be considered in order to avoid a later catastrophic failure.

As outlined above, the error signal is at least partially dependent on the difference between the value of the feedback signal and the set point value. It will be appreciated that the term 'at least partially dependent' is understood to mean that the error signal depends on the different between these values, even if there are other components to the error signal that depend on other external factors. In some examples, the error signal is dependent only on the difference between the value of the feedback signal and the set point value.

There are a number of methods, known in the art per se, that are suitable for determining the difference between the value of the feedback signal and the set point value. The control system may, at least in some examples, comprise a comparator arranged to perform the comparison of the value of the feedback signal to the set point value. The comparator may, in some such examples, comprise a sum block or an adder arranged to determine the difference between the value of the feedback signal and the set point value. In a set of examples, the control system comprises an inverter arranged to invert the feedback signal (i.e. to multiply the feedback signal by negative one) and a sum block or an adder arranged to add the value of the inverted feedback signal to the set point value to determine the difference between the value of the feedback signal and the set point value. In the alternative, the inverter could invert the set point value instead and add that to the value of the feedback signal (rather than an inverted copy).

It will be appreciated that, in some systems, the error signal may take positive and/or negative values, depending on the nature of the controlled system. While a positive threshold and a negative threshold could be used together in order to detect excessively large positive and negative error signals respectively, in some examples the value of the error signal is a magnitude of the error signal. An additional flag may be used to indicate whether the error signal was positive or negative at the time that the warning signal was raised which may provide additional information that could be useful for diagnosing the cause of the error.

Requiring the error signal to be greater than the threshold for at least the predetermined time period advantageously prevents the monitor triggering the warning signal each time that the error signal is large. A large error signal alone is not necessarily indicative of a fault with the controlled system, because deviations can and do occur. For example, during a start-up or shut-down procedure, the output of the plant may be significantly different to the desired set point and there will be some time required to drive the plant to that point. The predetermined period may therefore be chosen so as to assert the warning signal only when the error signal has been large for an 'abnormal' amount of time.

There are a number of ways in which the system can determine whether the value of the error signal exceeds the threshold value for longer than the predetermined period. Some examples use 'persistence', i.e. the value (e.g. the magnitude) of the error signal is monitored and a timer is used to determine if the threshold is exceeded for longer than the predetermined period. Thus, in some examples, the monitor comprises a timer arranged to measure a period in which the value of the error signal exceeds the threshold value and to compare the measured period to the predetermined period.

However, in some examples, the monitor comprises a low pass filter, wherein the low pass filter is arranged to produce an average of the error signal over a time window as the value of the error signal that is compared to the threshold value by the monitor. Those skilled in the art will appreciate that a low pass filter provides a 'rolling average' of its input across a time window, where the length of the averaging window is dependence on the properties of the filter. With appropriate selection of the filter characteristics (e.g. its corner frequency, bandwidth, etc.) and threshold value, the monitor will produce the warning signal once the error signal has been excessively high for an abnormally long period of time, indicating a possible issue. Such an arrangement does not require a timer, because the timing function is 'built in' to the filter function.

The control system of this disclosure may be readily applied to a variety of different plants, however in at least some examples the plant comprises a motor drive system.

It will be appreciated that in some systems, there are multiple plants that may be controlled separately, sometimes referred to as a 'multi-loop' system as there are multiple controlled 'loops'.

Thus, in some examples, the controlled system comprises: one or more further plants each arranged to receive a respective input signal and to provide a respective output signal at least partially dependent on the respective input signal; one or more further controllers each comprising a respective input arranged to receive a respective feedback signal derived from the output signal produced by the respective plant connected to said controller, each controller being arranged to compare a value of the respective feedback signal to a respective set point value and to produce a respective error signal that is at least partially dependent on a difference between the value of the respective feedback signal and the set point value of that controller, each controller further comprising an output arranged to supply said error signal to the respective plant; one or more further monitors each arranged to compare a value of the error signal produced by a respective controller to a respective threshold value; wherein each monitor is further arranged produce a respective warning signal when said value of the respective error signal exceeds the corresponding threshold value for a period of time greater than a respective predetermined period.

In systems having multiple controlled plants, controllers, and monitors, the controlled plants may be arranged in series, in parallel, or in a combination of series and parallel connections as appropriate. By way of non-limiting example, a controlled motor drive system may have a 'velocity loop' and a 'current loop'. The velocity loop may provide an output that controls a signal sent to the current loop based on a difference between the measured velocity at the output of the motor (the first plant) and a set point. The current loop acts to control a signal applied to the gate of a power switch (the second plant), e.g. a power field-effect-transistor or 'FET'), that determines the current supplied to the motor. The current loop may therefore control the signal applied to the gate based on a difference between the current at the output of the switch and the set point, i.e. it fine-tunes the control signal from the velocity loop to account for operational changes of the switch itself. The monitor of the velocity loop may therefore detect 'additional load' faults such as degraded bearings, a degraded drive shaft, or additional shaft load from a higher mechanical drive chain. Meanwhile, the monitor of the current loop may detect 'additional impedance' faults such as degradation of an electrical machine stator or a compromised inverter output.

There are a number of different types of controller known in the art per se, however in some examples the controller comprises a proportional-integral (PI) controller. In examples having multiple controllers, one or more of the further controllers may also comprise a PI controller. However, in other examples, the controller(s) may comprise a proportional (P) controller or a proportional-integral-derivative (PID) controller.

BRIEF DESCRIPTION OF THE DRAWINGS

Certain examples of the present disclosure will now be described with reference to the accompanying drawings, in which.

DETAILED DESCRIPTION

Figure 1:
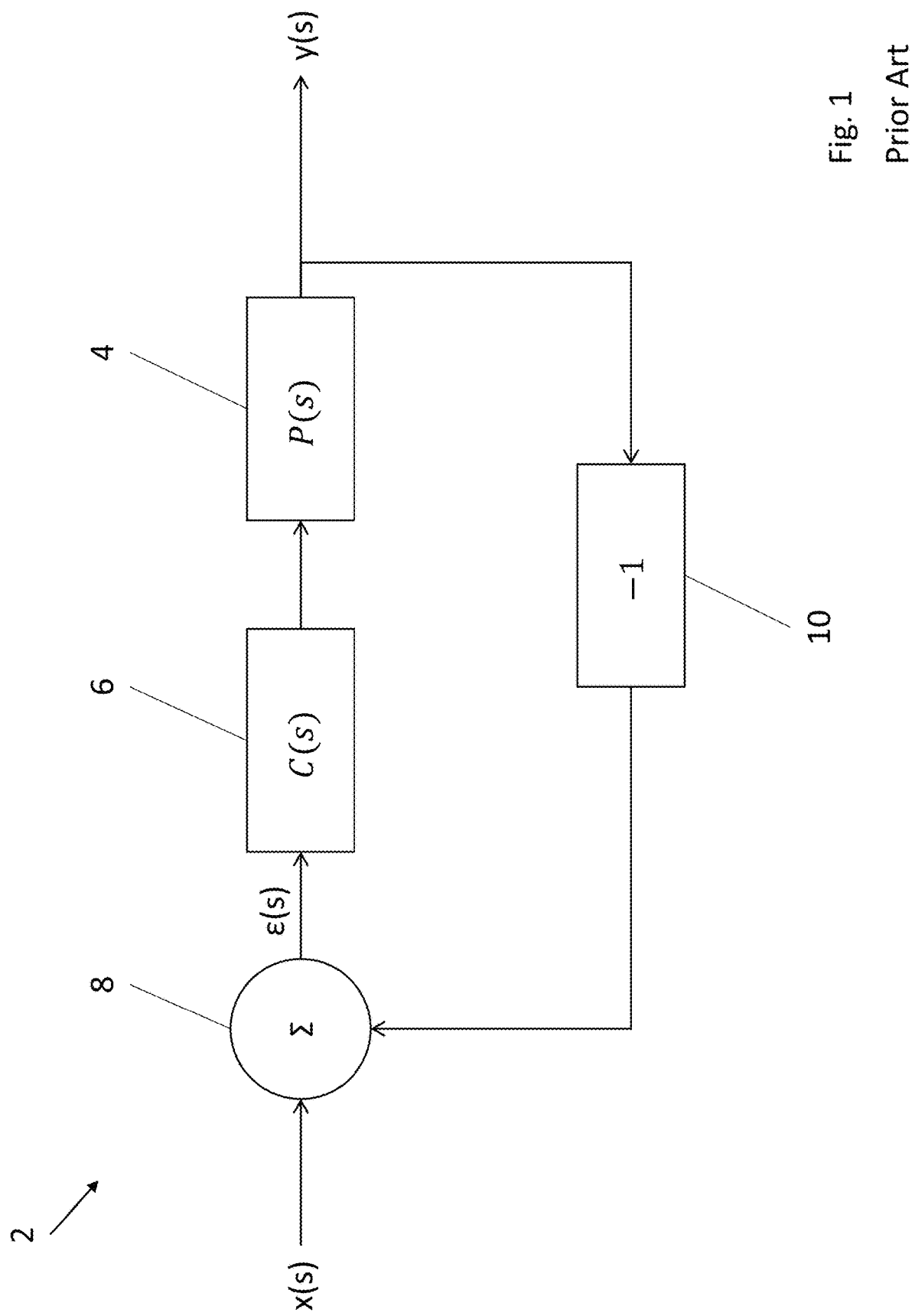
FIG. 1 is a block diagram of a typical closed loop controlled system.

FIG. 1 is a block diagram of a typical closed loop controlled system 2. The system 2 comprises a plant 4, a controller 6 including a sum block 8, and an inverter block 10. In practice, the controller 6 and inverter block 10 will generally all form part of the 'controller', however for the ease of description and illustration, these components are treated separately here. It will be appreciated that, as is standard notation in control theory, the functions shown in the accompanying drawings and described herein are in the Laplace domain (or 's-domain'), operating on the complex variable 's'.

An input—or 'demand'—x(s) is supplied to the sum block 8, together with the output of the inverter block 10, which is an inverted copy of the output y(s) of the plant 4. The sum block 8 produces an error signal ε(s) which is dependent on the difference between the input signal x(s) and the output signal y(s). The input signal x(s) may be a desired set point to which the system 2 is aiming to set the output y(s) of the plant 4. In this example, the input x(s), output y(s), and error signal ε(s) are fed into a scope 5, which is used to trace these signals. In practice, the system may not include such a scope.

The error signal ε(s) is input to the controller 6, which subjects the error signal ε(s) to its transfer function C(s). The output of the controller 6, which is dependent on error signal ε(s), is supplied to the input of the plant 4, which has a transfer function P(s) of its own. The output of the plant y(s) is fed back to the input of the controller 6 via the inverter block 10 and sum block 8 as outlined above.

Figure 2:
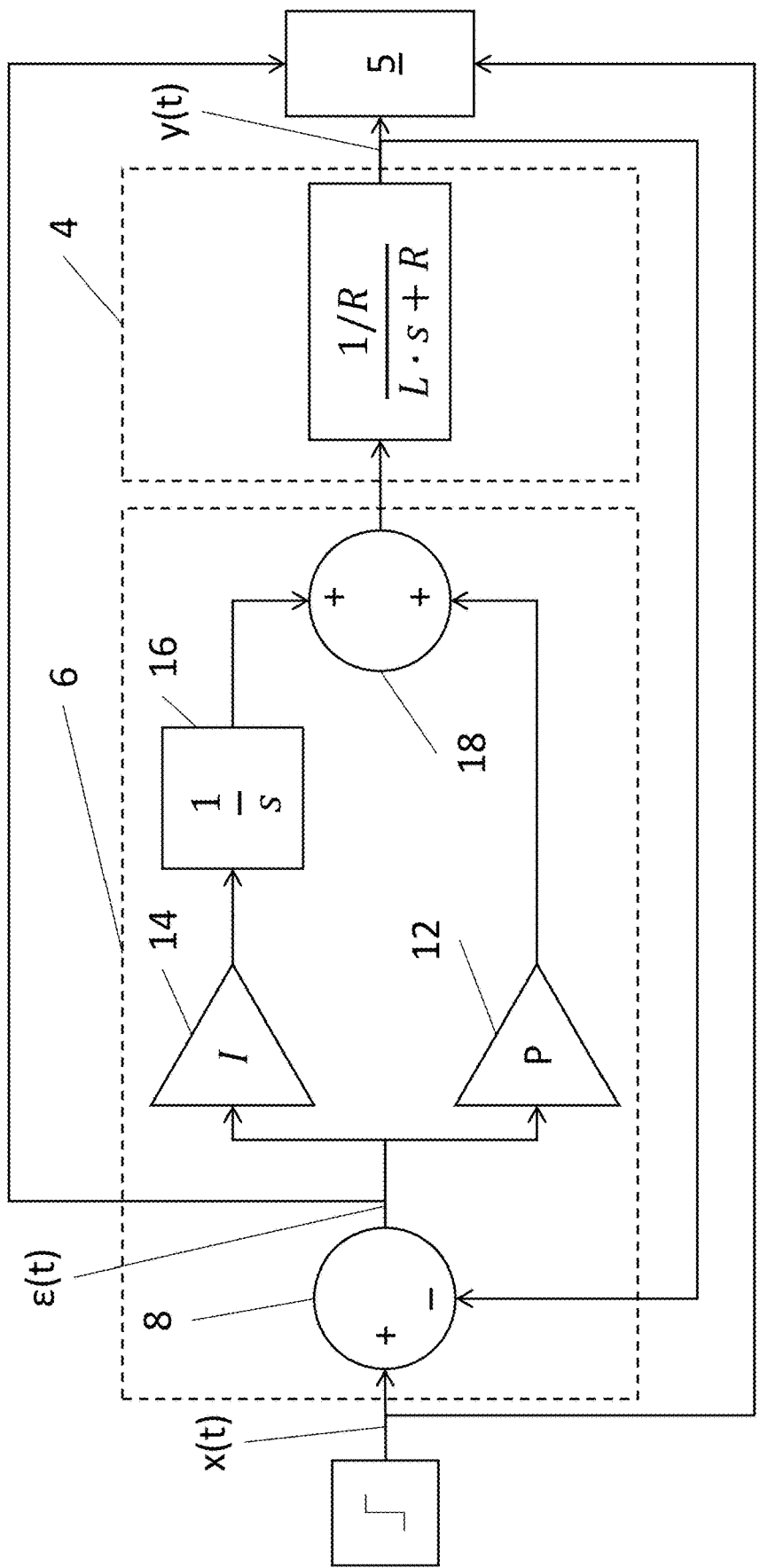
FIG. 2 is a control model of a typical current loop.

An exemplary prior art system 2 that uses this scheme is shown in FIG. 2, which is a control model of a typical current loop, using the principles described above with reference to FIG. 1.

In this system, the controller 6 can be seen in more detail, and comprises a proportional component 12, an integral component 14, a constant 16, and a sum block 18. The error signal ε(s), produced by the sum block 8 as outlined previously, is fed to both the proportional and integral components 12, 14 of the controller 6.

By way of example, the system 2 may comprise a simple current loop, i.e. the innermost loop of a motor drive acting on the resistor-inductor (R-L) of the stator. In such an example, the transfer function P(s) of the plant 4 may be as per Equation 1 below:

$$P(s) = \frac{k}{Ls + R} = \frac{\frac{1}{R}}{\frac{L}{R} \cdot s + 1}$$

Equation 1: Exemplary Transfer Function P(s) of a Plant where P(s) is the transfer function of the plant 4, k is the admittance of the motor, L is the inductance of the stator, R is the resistance of the stator, and s is the complex Laplace variable.

In such an example, the transfer function C(s) of the controller 6 may as per Equation 2 below:

$$C(s) = K_p + \frac{K_i}{s} = \frac{K_p s + K_i}{s}$$

Equation 2: Exemplary Transfer Function C(s) of a Controller where C(s) is the transfer function of the controller 6, $K_p$ is the coefficient of the proportional component of the controller 6, $K_i$ is the coefficient of the integral component of the controller 6, and s is the complex Laplace variable.

The generalised transfer function TF(s) of a controlled system is the ratio of the output y(s) to the input x(s), which is defined by Equation 3 below:

$$TF(s) = \frac{y(s)}{x(s)} = \frac{P(s) \cdot C(s)}{P(s) \cdot C(s) + 1}$$

Equation 3: Exemplary Generalised Transfer Function TF(s) of a Controlled System where y(s) is the system output, x(s) is the system input, P(s) is the transfer function of the plant, and C(s) is the transfer function of the controller.

Thus, when Equation 3 is applied to the motor drive system 2 example given above, the transfer function TF(s) of the motor drive system 2 as a whole is derived as per Equation 4 below:

$$TF(s) = \frac{y(s)}{x(s)} = \frac{K_i + K_p s}{LRs^2 + (R^2 + K_p)s + K_i}$$

Figure 3:
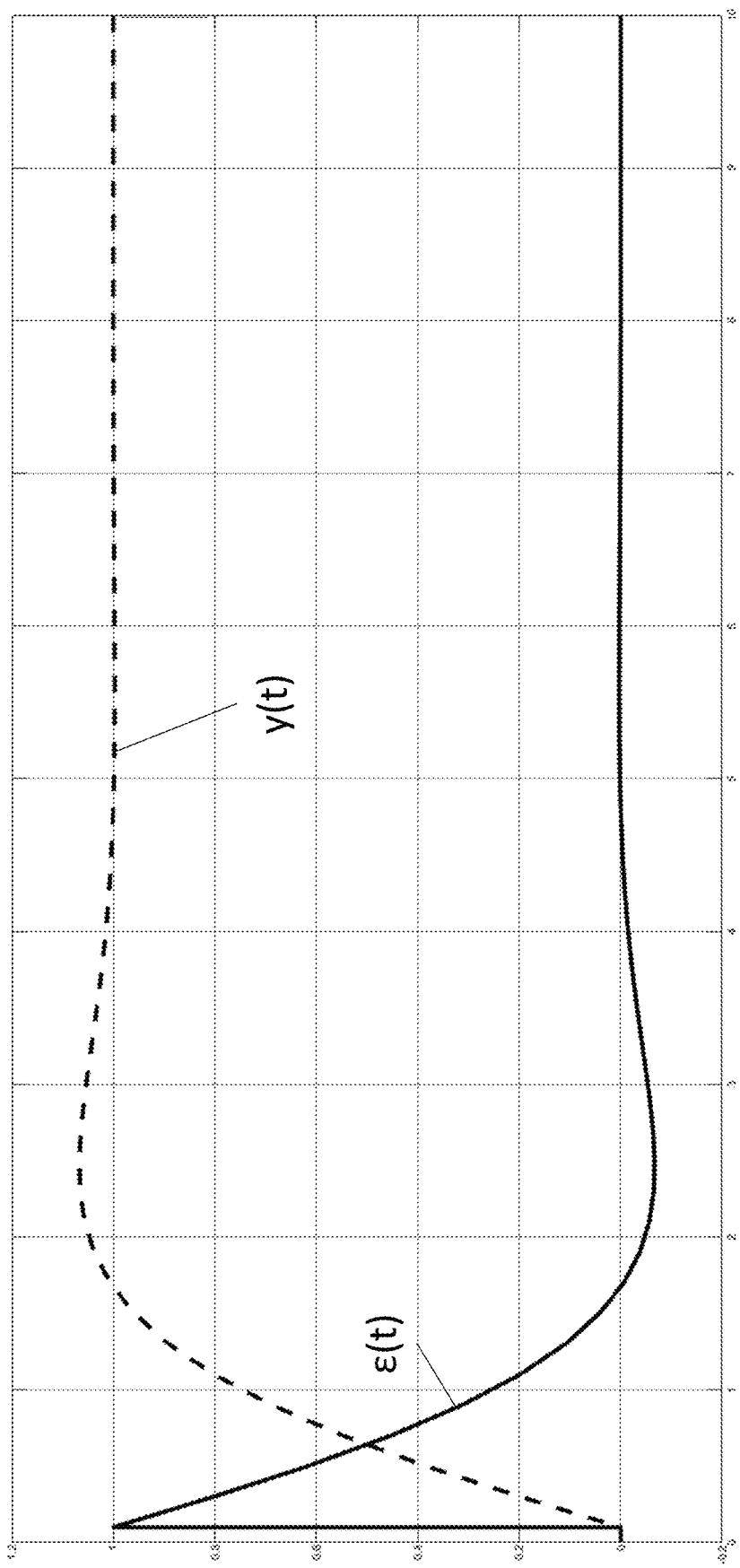
FIG. 3 is a graph showing the response of the current loops of FIG. 2.

Equation 4: Exemplary Transfer Function TF(s) of a Controlled Motor Drive System FIG. 3 is a graph showing the response of the current loops of FIG. 2. Specifically, FIG. 3 shows the output signal y(t), and error signal ε(t) in the time domain, where the error signal ε(t) is equal to the difference between the input demand signal x(t) and the output signal y(t).

In the graph of FIG. 3, the plant has a resistance R of 1Ω and an inductance L of 1 H. The controller 6 is tuned to have a natural frequency of √2 radians per second and has a Butterworth filter characteristic P=1 V/A, and I=2 Vs/A.

Initially, the input signal x(t) undergoes a step change from 0 to 1, while the output signal y(t) remains at 0 because it cannot change instantaneously. This results in the error signal ε(t) also taking the value 1 at the initial time. This error signal ε(t) is applied to the plant 4, which drives an increase in the output y(t) of the plant, thereby reducing the error signal ε(t).

As can be seen from the plot of the output signal y(t), the output of the plant 4 'overshoots' the value set by the demand, i.e. the input signal x(t), and thus the error signal ε(t) undergoes a negative overshoot. Subsequently, the output signal y(t) settles at the value set by the input signal x(t) and the error signal ε(t) tends to zero.

Figure 4:
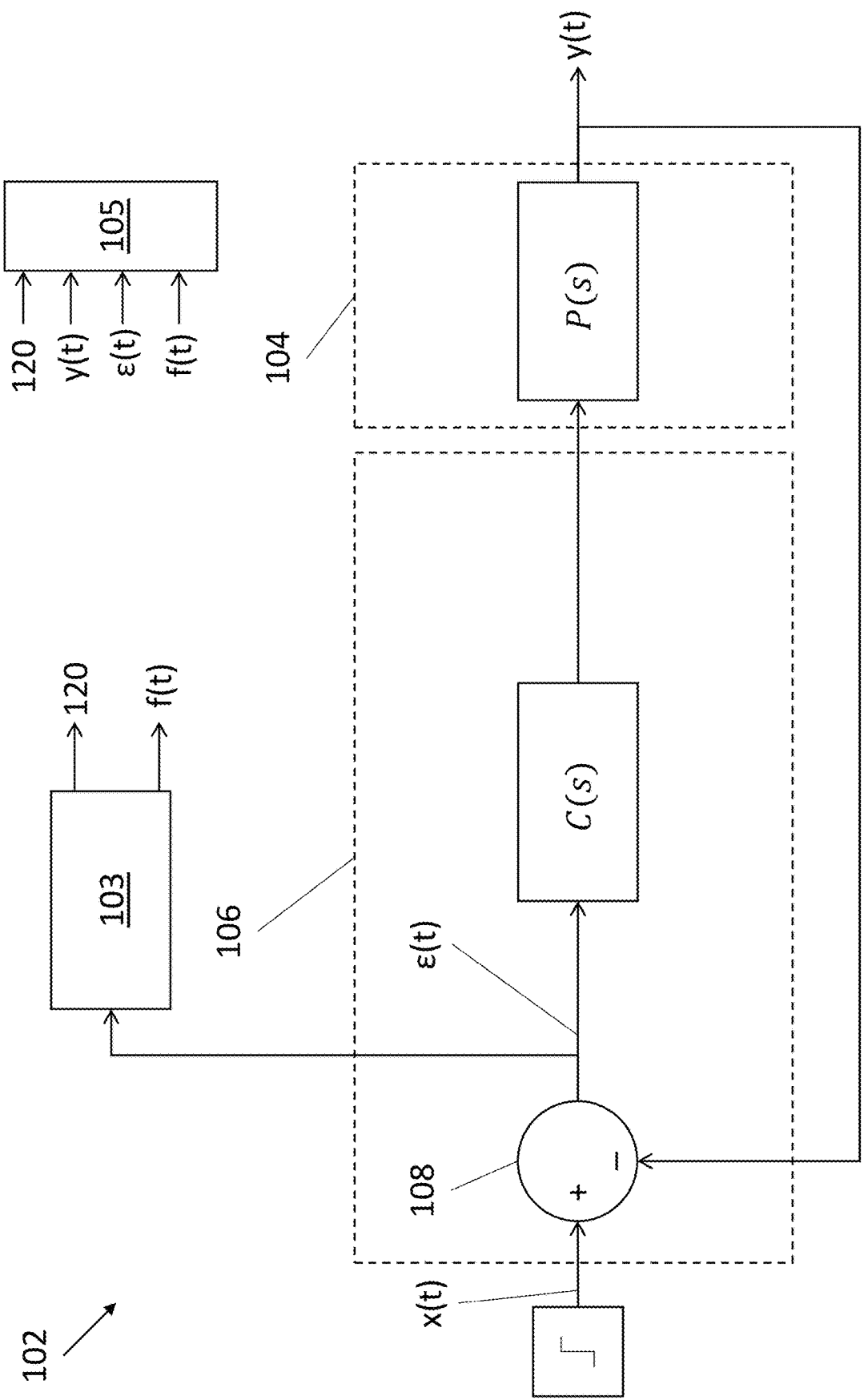
FIG. 4 is a control model of a closed loop control system in accordance with an example of the present disclosure.

FIG. 4 is a control model of a closed loop control system in accordance with an example of the present disclosure. The system 102 of FIG. 4 comprises a plant 104, a controller 106 which includes a sum block 108, and an inverter block 110. However, in addition, the system 102 of FIG. 4 further comprises a monitor 103, which is described in further detail below.

Figure 6:
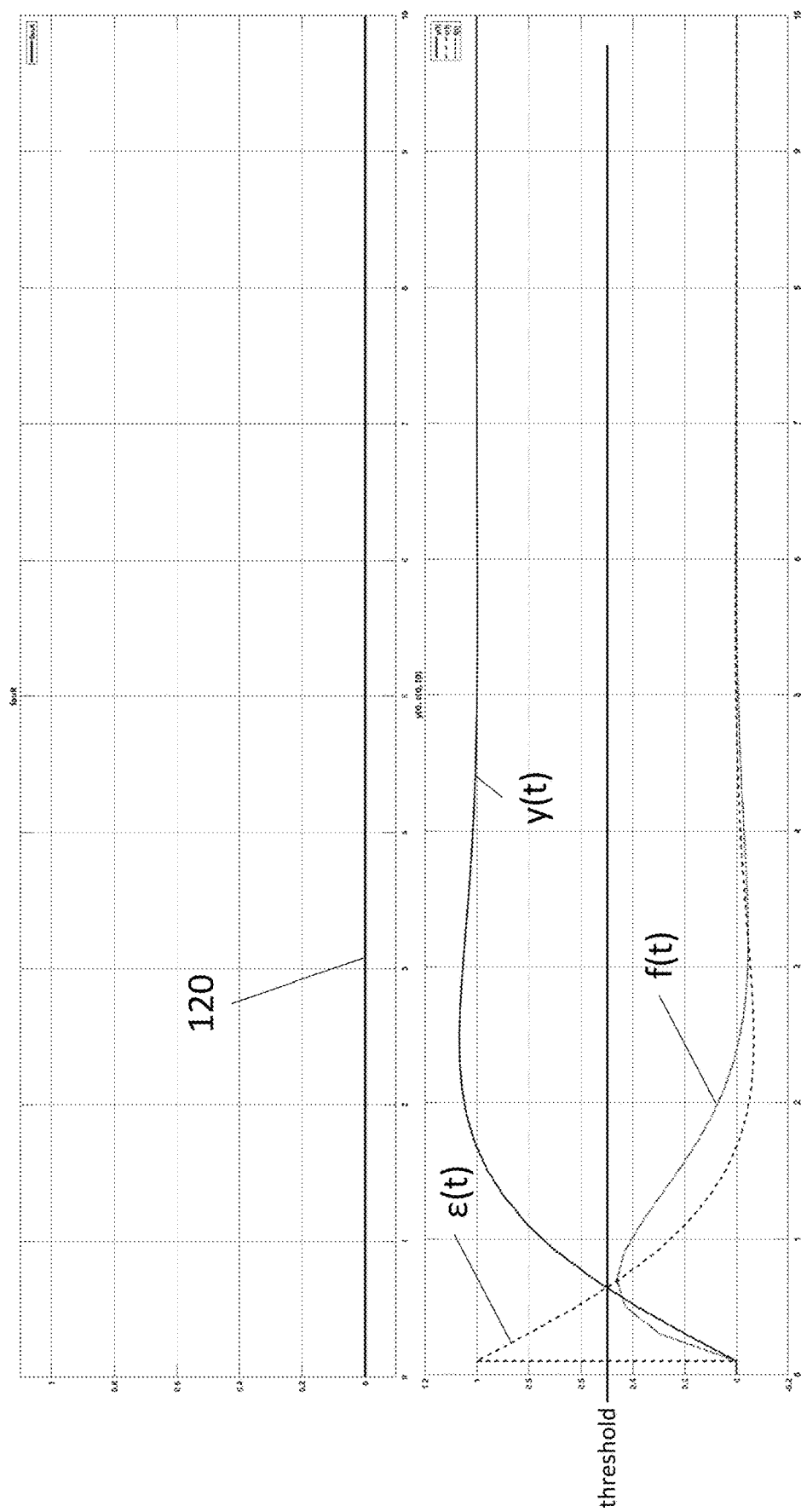
FIG. 6 is a graph showing the monitor output for design-case operation of the system of FIG. 5.
Figure 7:
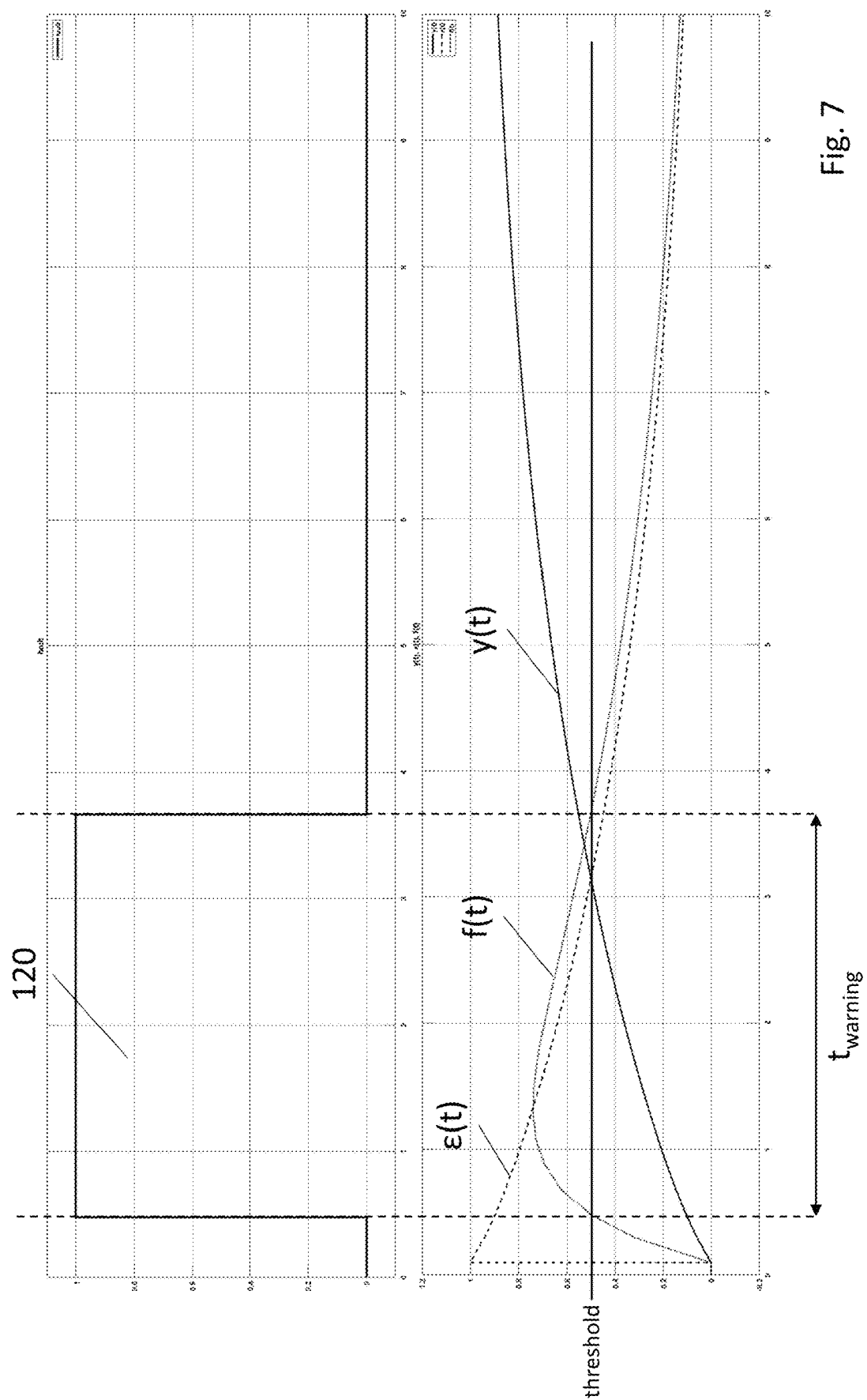
FIG. 7 is a graph showing the monitor output of operation of the system of FIG. 5 when the plant is compromised but under control.

In this example, the warning signal 120, output signal y(t), error signal ε(t), and filtered error signal f(t) are fed into a scope 105, which is used to trace these signals (as shown in the graphs of FIGS. 6 and 7). In practice, the system 102 may not include such a scope, however this is shown for ease of illustration.

Figure 5:
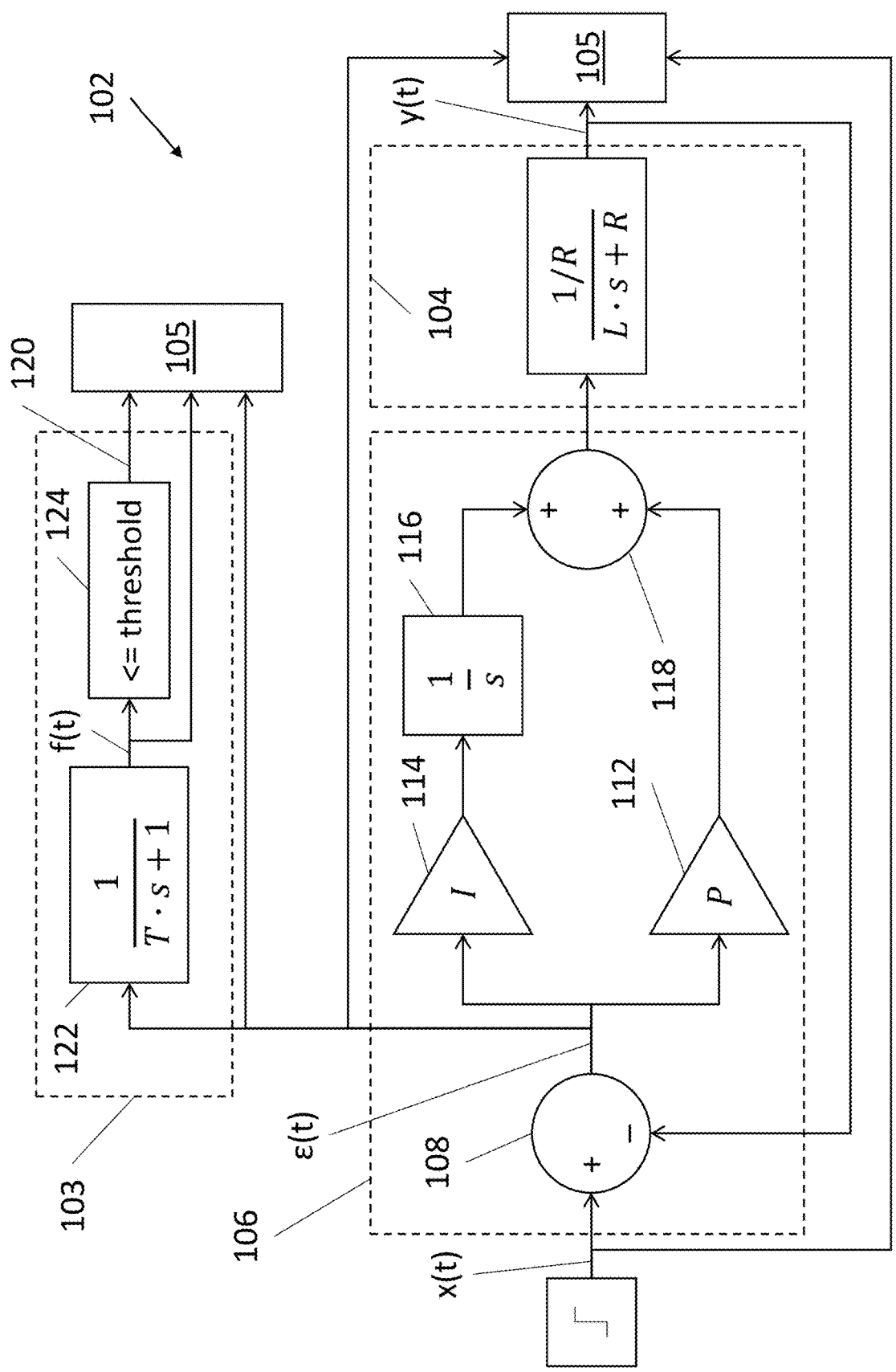
FIG. 5 is a control model of a particular closed loop control system in accordance with an example of FIG. 4.

The function of the control system of FIG. 4 may be understood with reference to a worked example, where FIG. 5 is a control model providing a specific implementation of the general model of FIG. 4 described above. As with FIG. 4, the system 102 of FIG. 5 comprises a plant 104, a controller 106, a sum block 108, an inverter block 110, and a monitor 103.

Functionally, the controller 106, sum block 108, and inverter block 110 will generally all form part of the 'controller', however one or more of these components could be separate from the other components. Similarly, the monitor 103 may be integral with the control 106 or may be partially or wholly separate.

It will be appreciated that, as is standard notation in control theory, the functions shown in the accompanying drawings and described herein are in the Laplace domain (or 's-domain'), operating on the complex variable 's'. Where time-domain inputs and outputs are connected to Laplace domain blocks, suitable domain conversions can be carried out as necessary.

The monitor 103 is arranged to compare a value of the error signal ε(t) to a threshold value. The monitor produces a warning signal 120 when said value of the error signal ε(t) exceeds the threshold value for a period of time greater than a predetermined period, as outlined below.

The monitor comprises a filter 122, characterised by a transfer function as per Equation 5:

$$F(s) = \frac{1}{T \cdot s + 1}$$

Equation 5: Exemplary Transfer Function F(s) of a Filter where F(s) is the transfer function of the filter 122 and T is a time delay parameter.

The filter 122 acts to 'smooth' the error signal ε(t) by averaging it over a time period determined through proper selection of the time delay parameter T. The output f(t) of the filter 122 is compared to a threshold by a comparator 124. If the output f(t) of the filter 122, i.e. the time-averaged value of the error signal ε(t), is greater than a threshold, a warning signal 120 is asserted by the monitor 103. The output f(t) of the filter 122 is supplied as an output of the monitor 103, together with the warning signal 120.

As it takes some time for the average f(t) of the error signal ε(t) to 'build up' to the threshold value, this avoids triggering of the warning signal 120 in response to a momentary spike in the error signal ε(t). This effect may be readily understood with reference to FIG. 6.

FIG. 6 is a graph showing the monitor output for design-case operation of the system 102 of FIG. 5. This shows operation of the system 102 when there are no defects in the system 102. Initially, a sudden change in the demand x(t) gives rise to a step change in the error signal ε(t). However, this is smoothed by the filter 122 and so the filtered signal f(s) at the output of the filter 122 does not cross the threshold, which in this instance is set to 0.5. Thus while the error signal ε(t) itself spikes to a value greater than the threshold, the filter provides a built in time delay such that the error signal ε(t) must be greater than the threshold for a sufficient amount of time before the warning signal 120 would be triggered. As such, the warning signal 120 is not triggered and remains at the value '0', where the value '0' indicates that no defects have been detected.

Conversely, FIG. 7 is a graph showing the monitor output of operation of the system 102 of FIG. 5 when the plant 104 is compromised but under control.

In this example, a change in the demand x(t) gives rise to a step change in the error signal ε(t). However, unlike in the case described above with reference to FIG. 6, in this example the error signal ε(t) sustains a high value for an abnormally long period of time. Thus, when the error signal ε(t) is smoothed by the filter 122, the filtered signal f(s) at the output of the filter 122 crosses the threshold for a period of time $t_{warning}$, where the threshold is set to 0.5. During this time $t_{warning}$, the warning signal 120 is triggered and changes from '0' to '1', where the value '1' indicates a warning of a defect. It will of course be appreciated that the roles of '0' and '1' could be reversed, depending on the implementation.

Thus in this instance, the error signal ε(t) itself has a value greater than the threshold for sufficient time that the such that the warning signal 120 is triggered. Once the warning signal 120 is triggered, an event may be logged, e.g. in the controller 106 or in an external device or system (such as a remote diagnostics system) that details the error. The logged event may include, for example, the date and time the error occurred, the location or devices associated with the error, the magnitude of the error, the sign of the error, the duration the error lasted, etc. Thus even if the plant 104 returns to normal, the occurrence of the error may be logged for later inspection.

Hysteresis may be used such that the error signal ε(t) must fall below a different value lower than the initial threshold for asserting the warning signal 120 before the warning signal 120 is de-asserted. Of course, with catastrophic damage to the plant 104 (e.g. due to a locked rotor in a motor system), the warning signal 120 may become permanently asserted until the cause of the issue is resolved.

Figure 8:
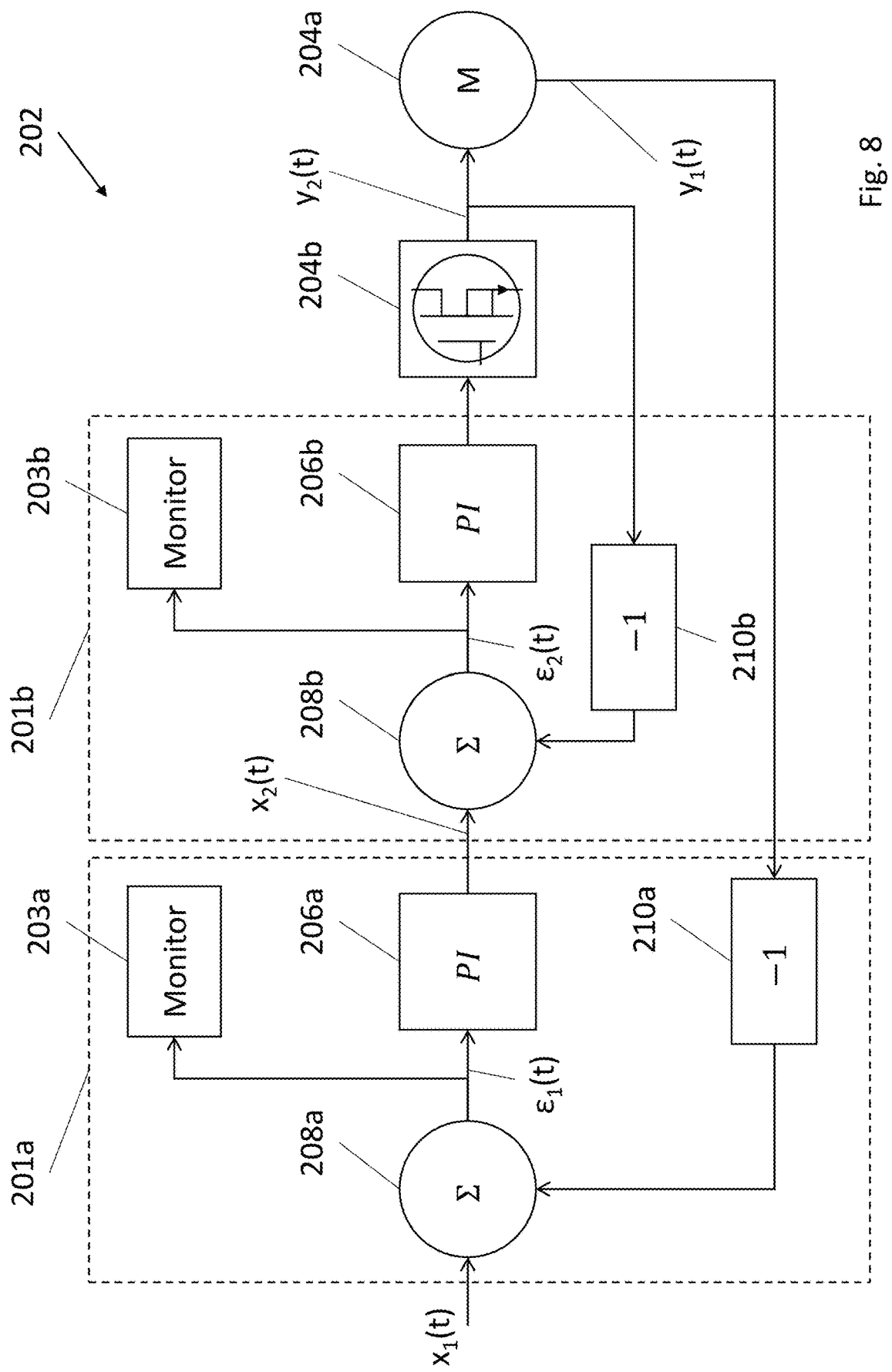
FIG. 8 is a block diagram of a multi-loop system in accordance with a further example of the present disclosure.

FIG. 8 is a block diagram of a multi-loop system 202 in accordance with a further example of the present disclosure. In this example, the multi-loop system 202 is a controlled motor drive system, which has a 'velocity loop' 201a and a 'current loop' 201b. The components in each loop 201a, 201b are similar to those described in reference to FIG. 5 above, where elements having reference numerals starting with a '2' in FIG. 8 correspond to like elements having reference numerals starting with a '1' in FIG. 5. For the ease of reference and illustration, the sum blocks 208a, 208b are shown separately to the rest of the respective controllers 206a, 206b, however it will be appreciated that in practice the sum blocks may be combined within their respective controllers.

The multi-loop system 202 controls the operations of two plants 204a, 204b. The first plant 204a, controlled by the velocity loop 201a, is a motor. The second plant 204b, controlled by the current loop 201b, is a power FET. The output signal y1(t) of the motor is fed back to the sum block 208a of the velocity loop 201a via a first inverter 210a, while the output signal y2(t) of the power FET is fed back to the sum block 208b of the current loop 201b via a second inverter 210b.

The controller 206a of the velocity loop 201a acts to steer the output of the motor (i.e. the first plant 204a). However, embedded within its path is the current loop, the controller 206b of which acts to steer the output of the power FET (i.e. the second plant 204b), the output of which is used to drive the motor. Thus the output of the controller 206a within the velocity loop 201a is provided as the input signal x2(t) to the current loop 201b.

As outlined above, the output signal y1(t) from the motor (i.e. the first plant 204a) is fed back to the sum block 208a, which determines the difference between the output y1(t) from the motor and the demand set by the input signal x1(t) and outputs the difference as a first error signal ε1(t). The first error signal ε1(t) is used by the first controller 206a to set a signal which is supplied to the current loop 201b as its input signal x2(t).

The controller 206b of the current loop 201b compares its input signal x2(t) to the feedback signal derived from the output signal y2(t) of the power FET, i.e. the second plant 204b, using the second sum block 208b. The second sum block 208b outputs a second error signal $\varepsilon_2$(t) which is used by the second controller 206b to set a signal which is supplied to the power FET, i.e. to the second plant 204b. This sets the conductance of the power FET, thus varying the current supplied to the motor. Thus the current loop 201b 'fine-tunes' the control signal from the velocity loop 201a to account for operational changes of the switch (i.e. the power FET) itself.

The first error signal ε1(t) produced by the first sum block 208a is input to a first monitor 203a which determines when the first error signal ε1(t) has been greater than a particular threshold for longer than a certain amount of time, in the same way described hereinabove in relation to the monitor 103 in the system 102 of FIG. 5. Similarly, the second error signal ε2(t) produced by the second sum block 208b is input to a second monitor 203b which determines when the second error signal ε2(t) has been greater than a particular threshold for longer than a certain amount of time. The thresholds and time periods used by the first and second monitors 203a, 203b may be (and generally are) different to one another.

The monitor 203a of the velocity loop 201a may therefore detect 'additional load' faults such as degraded bearings, a degraded drive shaft, or additional shaft load from a higher mechanical drive chain. Meanwhile, the monitor 203b of the current loop 201b may detect 'additional impedance' faults such as degradation of an electrical machine stator or a compromised inverter output.

Figure 9:
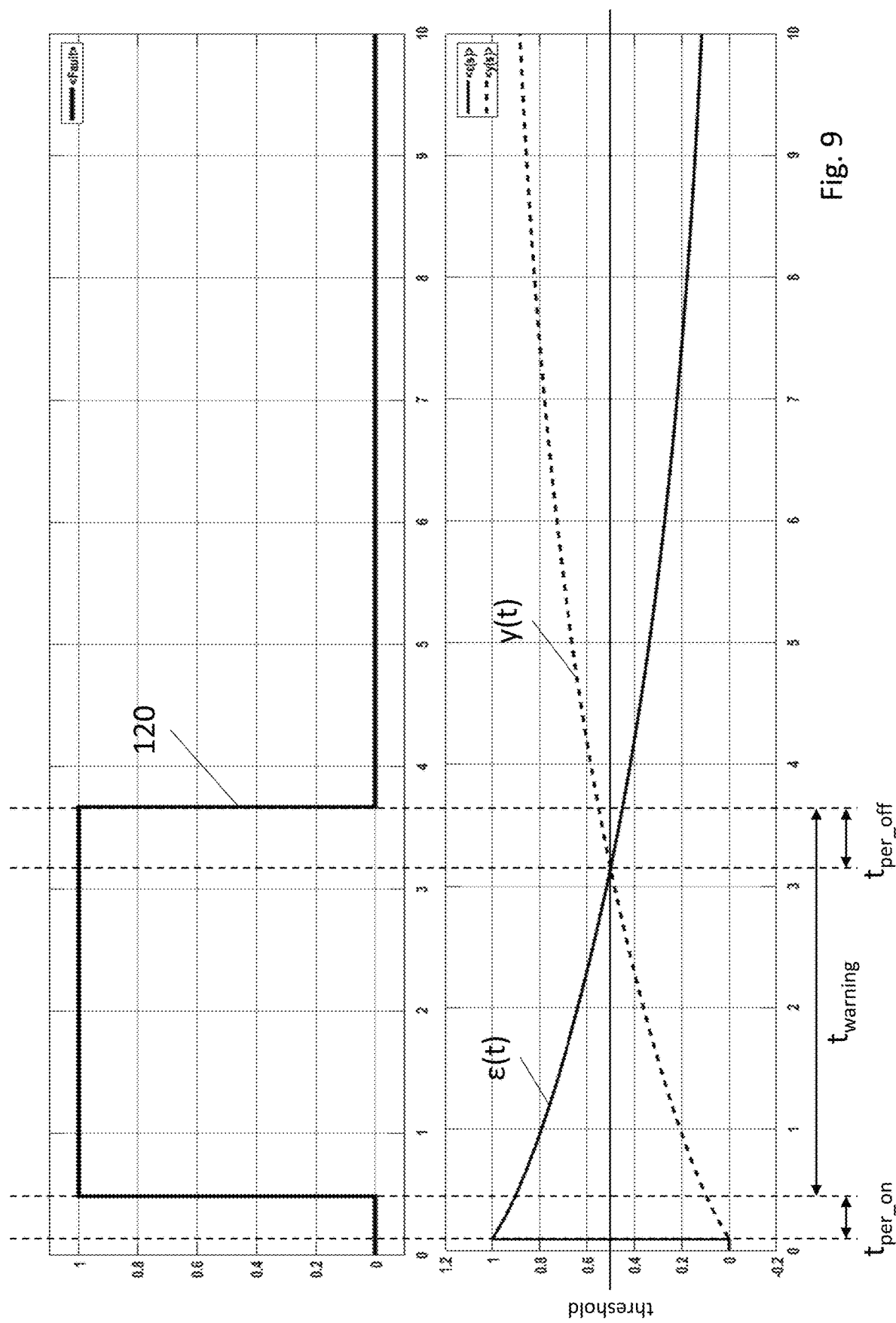
FIG. 9 is a graph showing the monitor output of operation of a system that uses persistence rather than a filter, in accordance with a further example of the present disclosure.

FIG. 9 is a graph showing the monitor output of operation of a system that uses persistence rather than a filter, in accordance with a further example of the present disclosure. Unlike in the filter-based example, in this arrangement the warning signal 120 is asserted (i.e. set to '1') when the error signal ε(t) is greater than a threshold—which, in this example, is set to 0.5—for longer than a predetermined amount of time tper_on.

Initially, a change in the input demand x(t) gives rise to a step change in the error signal ε(t). This sudden rise in the error signal ε(t) does not cause the warning signal 120 to be asserted immediately. Instead, the monitor waits for a duration $t_{per\_on}$ and if the error signal ε(t) still exceeds the threshold at that time, the warning signal 120 is asserted.

After some time, the error signal ε(t) drops back below the threshold. However, this does not immediately cause the warning signal 120 to be de-asserted. Instead, the error signal ε(t) must remain below a further persistence time tper_off before the warning signal 120 is de-asserted.

In either example, whether a filter or persistence is used, the system will generally log that the warning signal 120 has been asserted, e.g. in memory or by transmitting a suitable signal to an external maintenance centre. This log may contain various details relating to, e.g. the magnitude, sign, date, time, and operating conditions at the time of the error for further analysis.

Thus it will be appreciated by those skilled in the art that examples of the present disclosure provide an improved closed loop control system, method, and associated controlled systems, in which the operational health of the controller as well as the controlled system can be monitored for defects proactively. This may advantageously avoid catastrophic failure. Examples of the present disclosure may also provide for more 'intelligent' maintenance operations based on actual maintenance requirements rather than relying on a set maintenance schedule that may not reflect actual need.

While specific examples of the disclosure have been described in detail, it will be appreciated by those skilled in the art that the examples described in detail are not limiting on the scope of the disclosure.

The invention claimed is:

1. A closed loop control system for controlling a plant, the control system comprising:
   a controller comprising an input arranged to receive a feedback signal from the plant, said controller being arranged to compare a value of said feedback signal to a set point value and to produce an error signal that is at least partially dependent on a difference between the value of the feedback signal and the set point value, said controller further comprising an output arranged to supply said error signal to the plant;
   a monitor arranged to compare a value of the error signal produced by the controller to a threshold value;

wherein the monitor comprises a timer arranged to measure a period in which the value of the error signal exceeds the threshold value and to compare the measured period to a predetermined period;

wherein the monitor is further arranged to produce a warning signal when said value of the error signal exceeds the threshold value for a period of time greater than the predetermined period.

2. The closed loop control system as claimed in claim 1, comprising a comparator arranged to perform the comparison of the value of the feedback signal to the set point value.

3. The closed loop control system as claimed in claim 2, wherein the comparator comprises a sum block arranged to determine the difference between the value of the feedback signal and the set point value.

4. The closed loop control system as claimed in claim 3, comprising an inverter arranged to invert the feedback signal and a sum block arranged to add the value of the inverted feedback signal to the set point value to determine the difference between the value of the feedback signal and the set point value.

5. A closed loop controlled plant system comprising:
   a plant arranged to receive an input signal and to provide an output signal at least partially dependent on the input signal;
   a controller comprising an input arranged to receive a feedback signal derived from the output signal produced by the plant, said controller being arranged to compare a value of said feedback signal to a set point value and to produce an error signal that is at least partially dependent on a difference between the value of the feedback signal and the set point value, said controller further comprising an output arranged to supply said error signal to the plant;
   a monitor arranged to compare a value of the error signal produced by the controller to a threshold value;
   wherein the monitor comprises a timer arranged to measure a period in which the value of the error signal exceeds the threshold value and to compare the measured period to a predetermined period;
   wherein the monitor is further arranged to produce a warning signal when said value of the error signal exceeds the threshold value for a period of time greater than a predetermined period.

6. The closed loop controlled plant system as claimed in claim 5, further comprising:
   one or more further plants each arranged to receive a respective input signal and to provide a respective output signal at least partially dependent on the respective input signal;
   one or more further controllers each comprising a respective input arranged to receive a respective feedback signal derived from the output signal produced by the respective plant connected to said controller, each controller being arranged to compare a value of the respective feedback signal to a respective set point value and to produce a respective error signal that is at least partially dependent on a difference between the value of the respective feedback signal and the set point value of that controller, each controller further comprising an output arranged to supply said error signal to the respective plant;
   one or more further monitors each arranged to compare a value of the error signal produced by a respective controller to a respective threshold value;
   wherein each monitor is further arranged produce a respective warning signal when said value of the respective error signal exceeds the corresponding threshold value for a period of time greater than a respective predetermined period.

7. The closed loop controlled plant system as claimed in claim 5, comprising a comparator arranged to perform the comparison of the value of the feedback signal to the set point value.

8. The closed loop controlled plant system as claimed in claim 7, wherein the comparator comprises a sum block arranged to determine the difference between the value of the feedback signal and the set point value.

9. The closed loop controlled plant system as claimed in claim 8, comprising an inverter arranged to invert the feedback signal and a sum block arranged to add the value of the inverted feedback signal to the set point value to determine the difference between the value of the feedback signal and the set point value.

10. A method of controlling a plant in closed loop, the method comprising:
    receiving a feedback signal from the plant;
    comparing a value of said feedback signal to a set point value;
    producing an error signal that is at least partially dependent on a difference between the value of the feedback signal and the set point value;
    supplying said error signal to the plant;
    comparing a value of the error signal to a threshold value;
    measuring a period in which the value of the error signal exceeds the threshold value;
    comparing the measured period to a predetermined period; and
    producing a warning signal when the value of the error signal exceeds the threshold value for a period of time greater than a predetermined period.

11. A non-transitory computer-readable medium comprising instructions that, when executed by a suitable processor, carry out a method of controlling a plant in closed loop, the method comprising:
    receiving a feedback signal from the plant;
    comparing a value of said feedback signal to a set point value;
    producing an error signal that is at least partially dependent on a difference between the value of the feedback signal and the set point value;
    supplying said error signal to the plant;
    comparing a value of the error signal to a threshold value;
    measuring a period in which the value of the error signal exceeds the threshold value;
    comparing the measured period to a predetermined period; and
    producing a warning signal when the value of the error signal exceeds the threshold value for a period of time greater than a predetermined period.

* * * * *